(12) United States Patent
Lee et al.

(10) Patent No.: US 9,013,028 B2
(45) Date of Patent: Apr. 21, 2015

(54) INTEGRATED CIRCUIT PACKAGE AND METHOD OF MAKING

(71) Applicant: Texas Instruments Incorporated, Dallas, TX (US)

(72) Inventors: Lee Han Meng@Eugene Lee, Johor (MY); Sueann Lim Wei Fen, Melaka (MY); Sarel Bin Ismail, Duyong (MY)

(73) Assignee: Texas Instruments Incorporated, Dallas, TX (US)

( * ) Notice: Subject to any disclaimer, the term of this patent is extended or adjusted under 35 U.S.C. 154(b) by 66 days.

(21) Appl. No.: 13/734,402

(22) Filed: Jan. 4, 2013

(65) Prior Publication Data

US 2014/0191380 A1    Jul. 10, 2014

(51) Int. Cl.
*H01L 23/495*  (2006.01)
*H01L 23/00*   (2006.01)
H01L 23/31    (2006.01)
H01L 21/56    (2006.01)
H01L 21/48    (2006.01)

(52) U.S. Cl.
CPC . *H01L 23/49503* (2013.01); *H01L 2224/83192* (2013.01); *H01L 24/97* (2013.01); *H01L 2224/32245* (2013.01); *H01L 2224/48091* (2013.01); *H01L 2224/48247* (2013.01); *H01L 2224/73265* (2013.01); *H01L 2224/92247* (2013.01); *H01L 2224/27013* (2013.01); *H01L 2224/49113* (2013.01); *H01L 2224/49433* (2013.01); *H01L 2224/83101* (2013.01); *H01L 2224/85439* (2013.01); *H01L 2924/00014* (2013.01); *H01L 24/83* (2013.01); *H01L 24/27* (2013.01); *H01L 24/29* (2013.01); *H01L 24/32* (2013.01); *H01L 24/48* (2013.01); *H01L 2224/27312* (2013.01); *H01L 2224/2919* (2013.01); *H01L 2224/83447* (2013.01); *H01L 2224/83862* (2013.01); *H01L 23/3107* (2013.01); *H01L 21/561* (2013.01); *H01L 2224/97* (2013.01); *H01L 23/49513* (2013.01); *H01L 23/49541* (2013.01); *H01L 23/49548* (2013.01); *H01L 23/49582* (2013.01); *H01L 21/4842* (2013.01)

(58) Field of Classification Search
USPC .......................................... 257/666, 676, 787
See application file for complete search history.

(56) References Cited

U.S. PATENT DOCUMENTS

| | | | | |
|---|---|---|---|---|
| 5,278,446 | A * | 1/1994 | Nagaraj et al. | 257/707 |
| 2008/0067640 | A1* | 3/2008 | Do et al. | 257/666 |
| 2009/0230526 | A1* | 9/2009 | Chen et al. | 257/676 |
| 2009/0250795 | A1* | 10/2009 | Hooper et al. | 257/676 |
| 2010/0283142 | A1* | 11/2010 | Feng et al. | 257/712 |
| 2012/0080781 | A1* | 4/2012 | Li et al. | 257/676 |
| 2012/0119342 | A1* | 5/2012 | Chang Chien et al. | 257/676 |

* cited by examiner

*Primary Examiner* — S. V. Clark
(74) *Attorney, Agent, or Firm* — Steven A. Shaw; Frank D. Cimino

(57) ABSTRACT

An integrated circuit ("IC") device and method of making it. The IC device may include a conductive lead frame that has a die pad with a relatively larger central body portion and at least one relatively smaller peripheral portion in electrical continuity with the central body portion. The peripheral portion(s) project laterally outwardly from the central body portion of the die pad. Lateral displacement of a portion(s) of an encapsulation layer overlying the peripheral portion(s) is resisted by abutting surfaces on the peripheral portion(s) and the encapsulation layer.

8 Claims, 10 Drawing Sheets

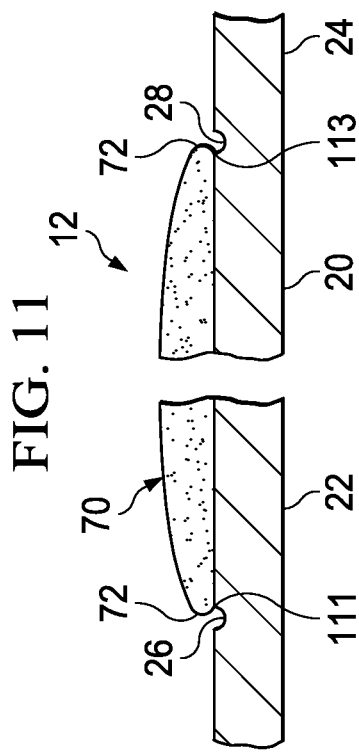
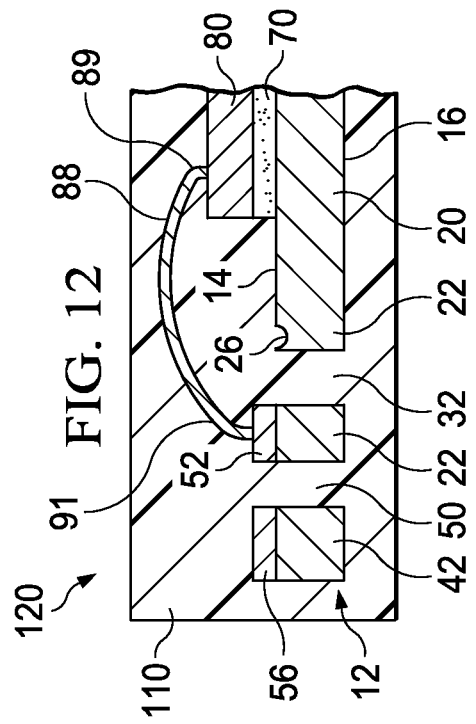

INTEGRATED CIRCUIT PACKAGE AND METHOD OF MAKING

BACKGROUND

Integrated circuit ("IC") packages are ubiquitous in modern electronic devices. A typical integrated circuit package includes an IC die ("chip"), a lead frame and a layer of protective encapsulant. Lead frames are formed by cutting a pattern cut in a thin sheet of conductive material such as copper. Lead frames typically come in strip form with many identical lead frame patterns provided in a grid array on the strip.

An IC die is a small block of semiconductor material such as silicon in which an electrical circuit that performs a predetermined function is provided. Dies often have contact pads on a top surface that allow the die circuit to be connected to external circuits.

Copper lead frames are subject to oxidation, which may cause welded connections thereto, such as wire bonded connections, to be subject to failure. For this reason, copper lead frames are often plated with other metals, such as silver, which prevents oxidation. When such metal plating is performed it is usually done prior to die mounting. Generally the entire lead frame is plated in a single operation such as by electro plating.

The usual method of forming IC packages includes mounting a number of identical dies on the identical lead frame portions of a plated lead frame strip. A bottom surface of each die is attached to a central portion of each lead frame, known as a die attach pad, usually by a layer (also sometimes referred to herein as "patch") of epoxy. The epoxy, when applied to the die pad, is in a paste form. The position and the amount of epoxy applied to each die pad needs to be carefully controlled to prevent the epoxy from smearing and overflowing onto adjacent regions of the lead frame, where it may interfere with other packaging processes. After placing each die on a corresponding patch of epoxy paste, the lead frame strip is moved to a heat source such as a curing oven where the epoxy is cured.

After curing the epoxy, the dies are electrically connected to the corresponding lead frames. In a typical process, contact pads on the dies are electrically connected to predetermined regions on the corresponding lead frames by small thin wires by a process called wire bonding. A first end of each wire is typically bonded to a preselected die contact pad by a welding process known as first bond. A second end of each wire is typically bonded to a preselected portion of each lead frame by another bonding process known as second bond or wedge bond. Both of these bonding processes are well known and understood by those skilled in the art.

After wire bonding is completed the lead frame strips are moved to mold stations where a mold compound is applied that covers the dies, wire bonds and a large portion of each of the lead frames. Small end portions of each lead frame and the web that interconnects the lead frames are not coated with mold compound. The applied mold compound is heated until it cures to a solid state. The cured mold compound protects the encapsulated portion of each lead frame, the associated die and wire bond connections.

After curing of mold compound, the lead frame strip is cut apart or "singulated" to separate the strip into individual IC packages. Each IC package includes an encapsulated lead frame and die.

After singulation the circuitry of each IC package is tested, and those having circuit failures are discarded. A common cause of IC failures is broken welds between wire bonding wires and the lead frame. The development of production processes that reduces such defective IC packages is a continuing goal in the industry.

BRIEF DESCRIPTION OF THE DRAWINGS

FIG. 11 is a detailed cross-sectional view of a portion of a lead frame and epoxy paste applied thereto.

FIG. 12 is a detailed cross-sectional view of a lead frame and die covered with encapsulant.

DETAILED DESCRIPTION

Figure 1:
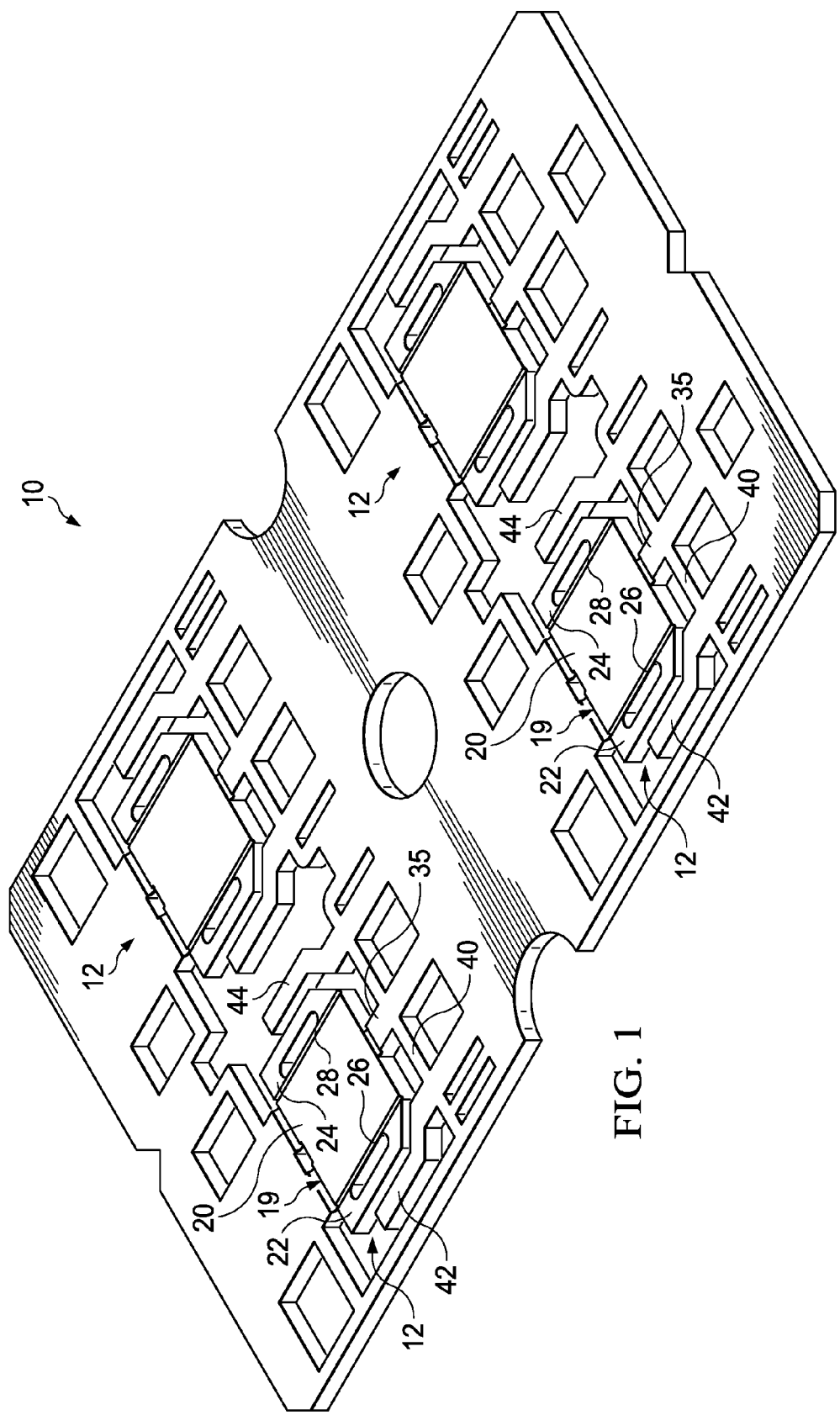
FIG. 1 is a top isometric view of a lead frame strip.

This disclosure, in general, relates to an integrated circuit device 120 and a method of making it. The IC device 120, FIG. 10, may include a conductive lead frame 12 that has a die pad member 19 with a relatively larger central body portion 20 and at least one relatively smaller peripheral portion 22, 24 in electrical continuity with the central body portion 20. The peripheral portion(s) 22, 24 project laterally outwardly from the central body portion 20 of the die pad member 19. Each peripheral portion 22, 24 has at least one abutment surface, e.g. 26, 28, 32, 34, FIG. 3. Predetermined portions of the lead frame 12 are plated. A die 80 having a plurality of conductor pads 82, 84, 86, etc. on a top surface 81 is mounted on the lead frame 12, FIG. 7. A bottom surface 83 of the die 80 is attached to the central body portion 20 of the die pad member. At least one wire 88 is bonded at a first end 89 to one of the conductor pads 82 and at a second end 91 to the peripheral portion 22 of the die pad member 19. No wire is connected between any of the conductor pads 82, 84, etc. and the central body portion 20. A layer of encapsulant 110 (sometimes referred to herein as "encapsulation layer 110"), FIG. 12, covers the die 80 and the wire(s) 88 and most of the lead frame 12. The encapsulation layer 110 has one or more portions engaging at least one abutment surface 26, 32 so as to resist lateral displacement of the peripheral portion 22 relative to the encapsulation layer 110 in the proximity of the abutment surface(s) 26, 32. Having thus described an embodiment of an IC device 120 generally, various other embodiments and methods of making an IC device 120 will now be described in detail.

FIG. 1 is a top isometric view of a portion of a lead frame strip 10 having four separate lead frames 12 formed thereon. Each lead frame strip 10 contains multiple cutout portions which define each lead frame 12, and may also contain other cutouts which facilitate movement of a lead frame between various stations where different fabrication processes take place. Lead frame displacement and handling techniques and equipment used for these purposes are well known to those skilled in the art and are thus not shown or described in detail herein.

Figure 2:
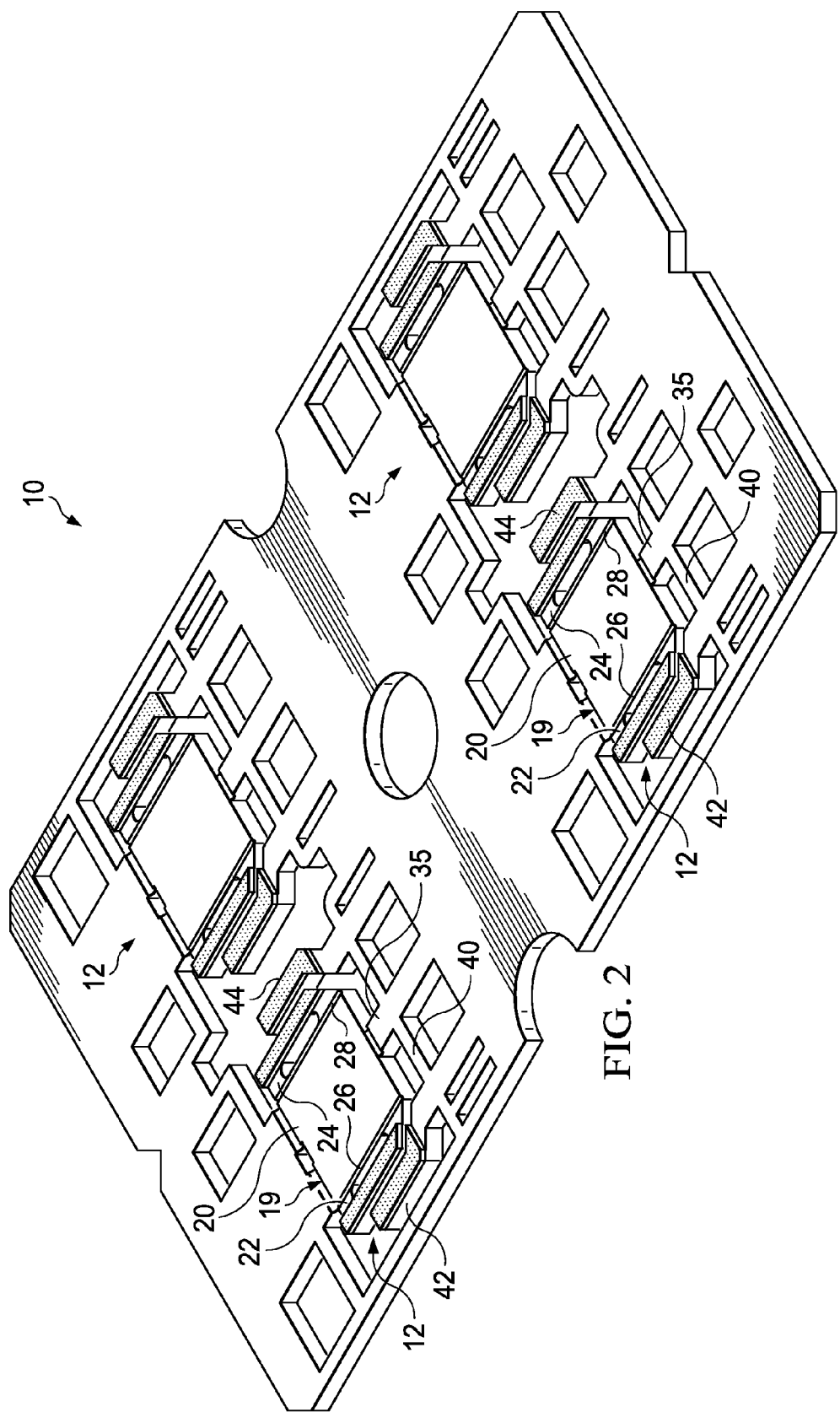
FIG. 2 is a top isometric view of a lead frame strip with plating.
Figures 3, 4:
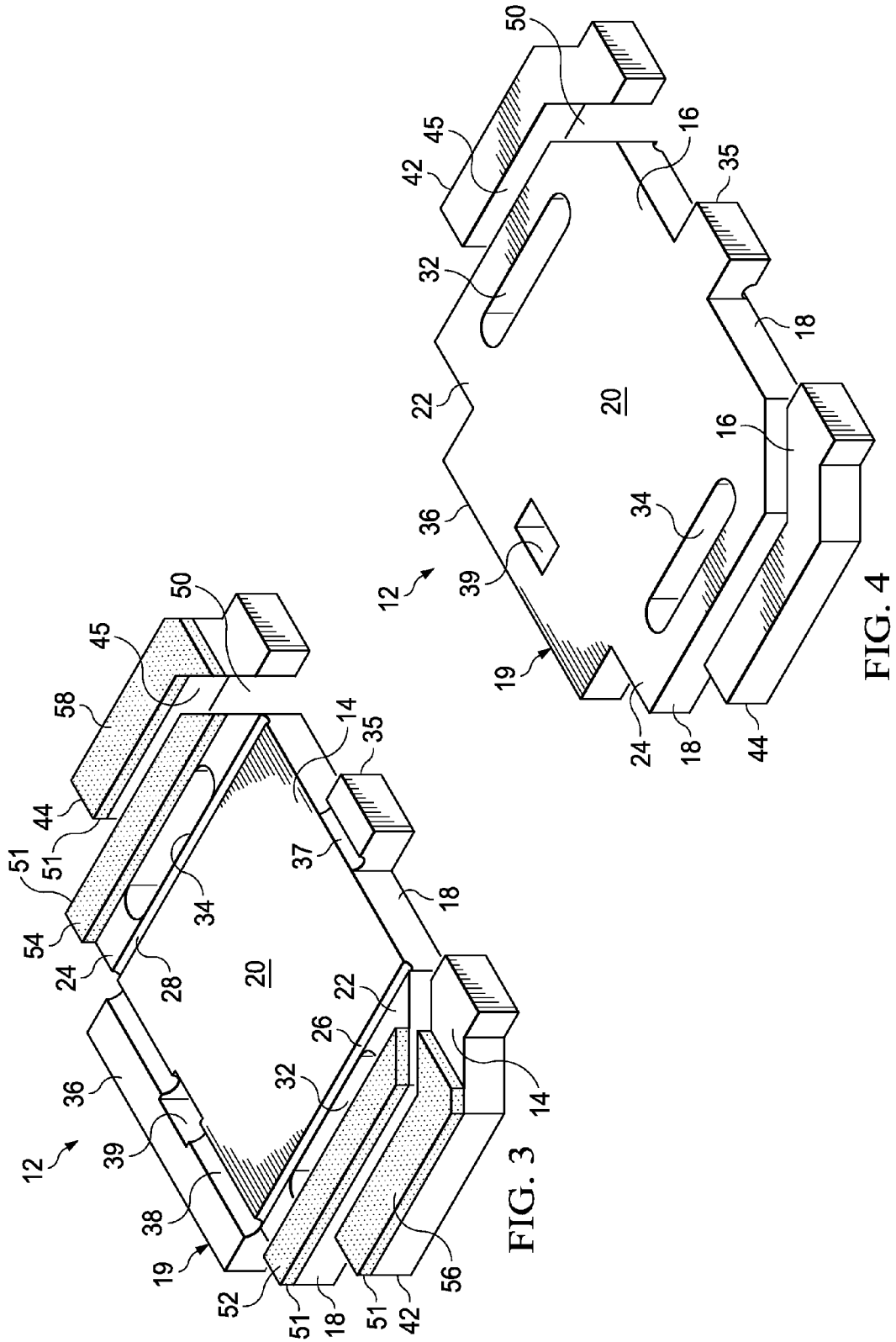
FIG. 3 is a detail top isometric view of a lead frame with plating.
FIG. 4 is a detail bottom isometric view of the lead frame of FIG. 3.

FIG. 2 illustrates the lead frame 10 of FIG. 1 after an initial plating operation. In one embodiment, the lead frame is made from copper and the plating is silver, which may be applied by known plating processes such as electro plating. FIGS. 3 and 4 are detailed top and bottom isometric views of one lead frame 12 in the lead frame strip 10 of FIG. 2. As best shown by FIGS. 3 and 4, each lead frame 12 includes a relatively large, integral die pad member 19 and two separate finger members 42, 44. Each of the members 19, 42, 44 has generally flat top and bottom surfaces 14, 16 connected by a peripheral edge surface 18. The lead frame die pad member 19 has a central body portion 20, which may have a generally rectangular shape. The lead frame 12 further includes first and second ear portions 22, 24 which may have top and bottom surfaces generally coplanar with the top and bottom surfaces of the central body portion 20. First and second longitudinally extending grooves 26, 28 separate the first and second ear portions 22, 24 from the central body portion 20. The first ear portion 22 has a first longitudinally extending hole or slot 32 therein and the second ear portion 24 has a second longitudinally extending hole or slot 34 therein. Each hole/slot 32, 34 extends all of the way through the respective ear portions 22, 24. In one embodiment, each of the grooves 26, 28 has a semicircular cross section that may have a radius of about 0.15 mm. Each of the grooves 26, 28 may have a length of about 2 mm to 3 mm. In one embodiment each slot 32. 34 may have a width of about 0.3 mm and a length of about 2 mm. A typical lead frame thickness range is about 0.2 mm to 0.3 mm.

The die pad member 19 may also include a first longitudinally extending tab portion 35 and a second longitudinally extending tab portion 36 that are integrally connected to the central body portion 20 at opposite longitudinal ends thereof. The two tab portions 35, 36 interface with the central body portion 20 along first and second longitudinally extending grooves 37, 38. The second longitudinally extending groove 38 may have a laterally extending hole/slot 39 centered therein as best shown in FIGS. 3 and 4. In one embodiment the grooves 37, 38 may have cross sections similar in size and shape to the grooves 26, 28.

First and second generally longitudinally extending finger members 42, 44 have inner edge surfaces 45 that extend parallel to the outer edge surfaces 18 of each ear portion 22, 24. Each oppositely positioned pair of surfaces 45, 18 may have a bend therein which in one embodiment may be about 135°. The opposite surfaces 45, 18 may thus define a hockey stick shaped opening 50 there between. It may be seen from FIGS. 1 and 2 that the first longitudinally extending tab portion 35 and each of the finger portions 42, 44 are connected to a common laterally extending rib 40 prior to singulation from the lead frame strip 10. However, after singulation, as discussed below with reference to FIGS. 9 and 10, the integral die pad member 19 and the two finger members 42, 44 are no longer integrally connected.

As best illustrated in FIG. 3, plating material 51 is selectively applied to the two finger members 42, 44 and the two ear portions 22, 24. A silver plated region 52 of the first ear portion 22 may be a longitudinally extending strip having as borders the outer edge of the ear portion 22 and the outer edge of the longitudinal slot 32 and a linear projection thereof and the opposite longitudinal ends of the ear portion 22. A silver plated region 54 of the second ear portion 24 may be provided in a substantially mirror image relationship with the silver plated region 52 on the first ear portion 22. The silver plated regions 52, 54 may be applied only to the top surface of the ear portions 22, 24. A silver plated region 56, 58 may also be provided on each of the finger members 42, 44 on a top surface thereof and may cover the entire top surface of each finger region down to a line approximately aligned with the lower edge of the central body portion 20. Each silver plated region 52, 54, 56, 58 is adapted to have lead wires welded thereto as described in further detail below. Silver plating of copper prevents oxidation of the underlying copper. Generally, wire bonds made to silver plated copper lead frame portions are less subject to failure than wire bonds made directly to copper. However epoxy does not adhere well to silver plated copper. Applicants have optimized wire bond welds by selectively plating regions that are to have wire bond welds made thereon. Applicants have optimized epoxy adhesion to the central body portion 20 by not silver plating this region.

Figure 5:
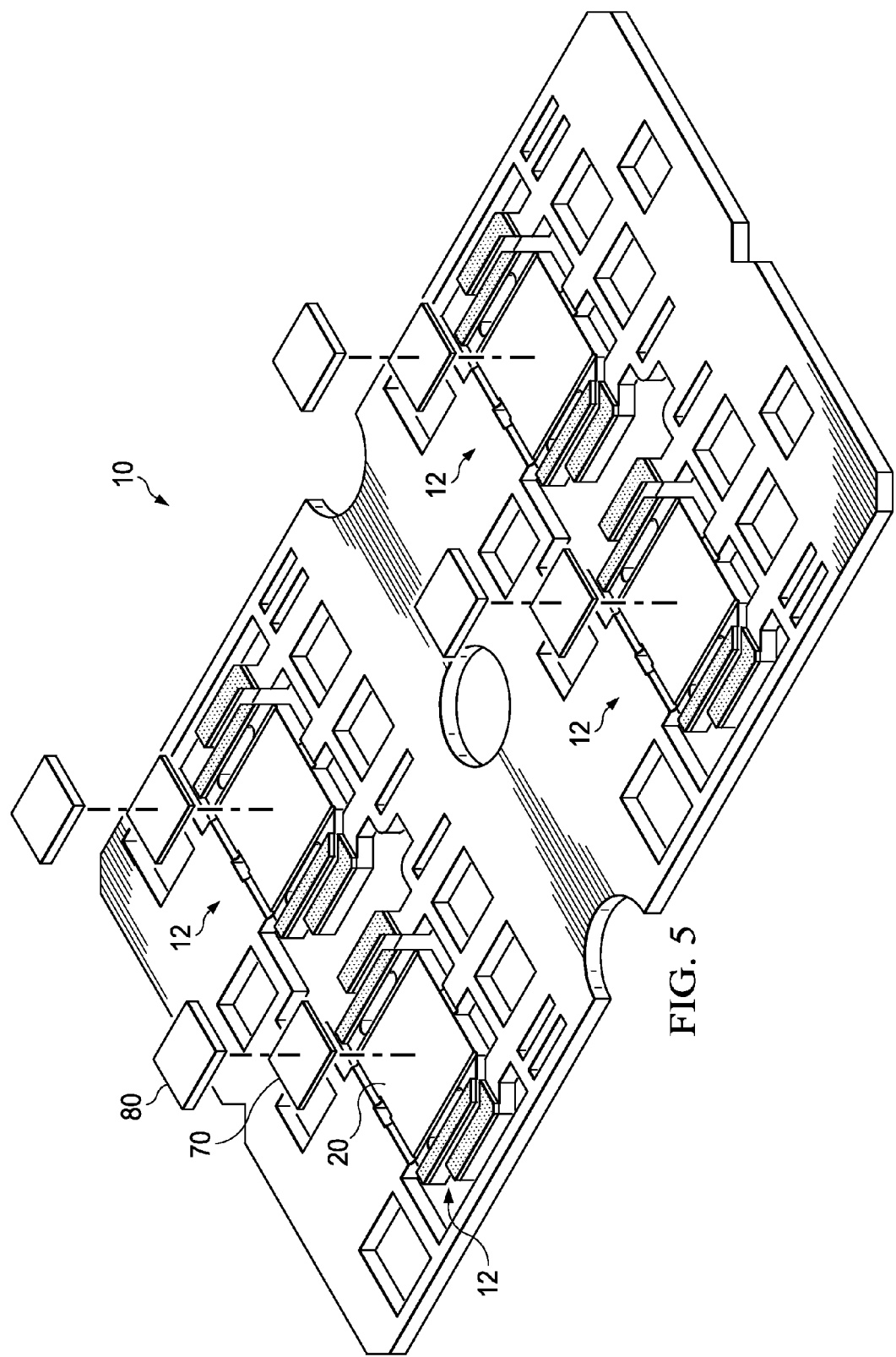
FIG. 5 is an exploded top isometric view of a lead frame strip showing the application of epoxy patches and dies to the lead frame strip.

FIG. 5 is a top isometric view of the lead frame strip 10 showing the position of epoxy patch or layer 70 and dies 80 that are applied to the central body portion 20 of each lead frame 12. The epoxy patch may be applied by conventional means such as an epoxy liquid dispensing syringe (not shown). Each die 80 may be positioned on a corresponding epoxy layer 70 by conventional means such as a pick and place machine (not shown). The epoxy layers 70 may be conventionally cured as with a curing oven.

Figure 6:
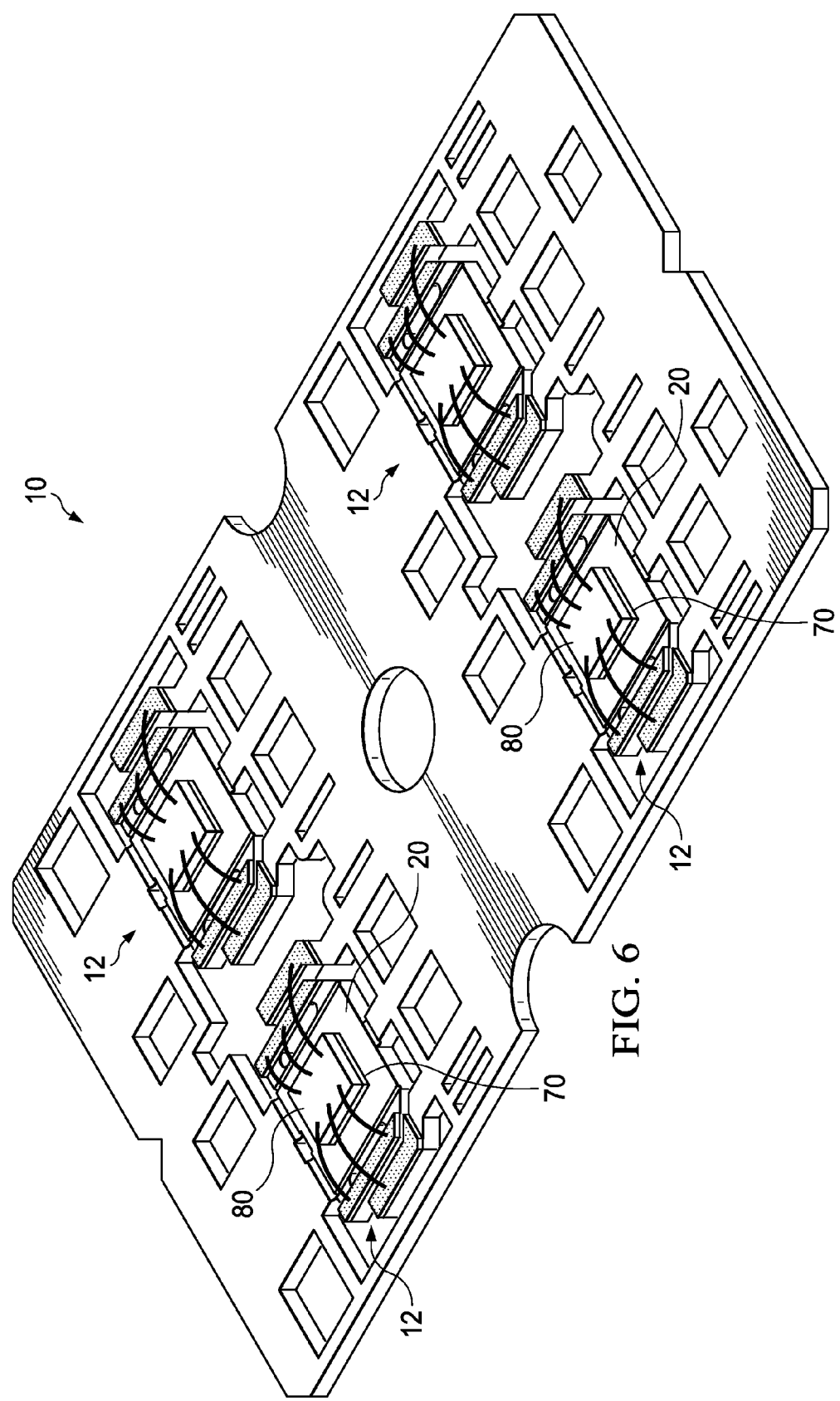
FIG. 6 is a top isometric view of a lead frame strip showing dies electrically attached to the lead frame by wire bonding.
Figure 7:
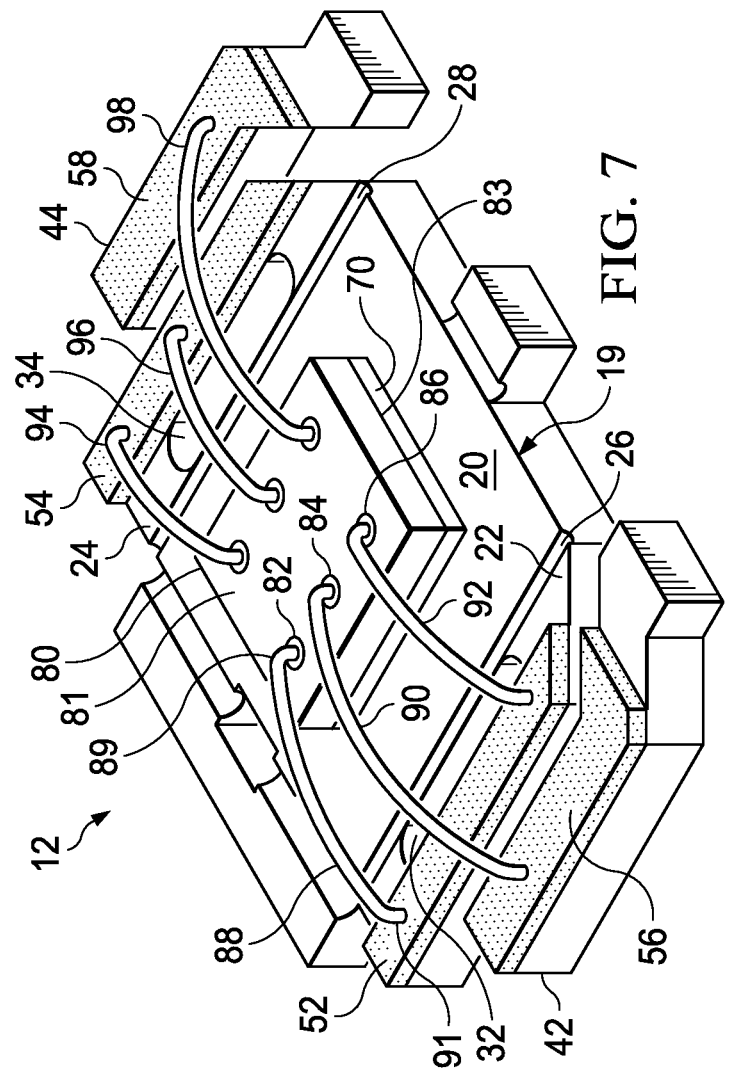
FIG. 7 is a detail top isometric view of one lead frame and die assembly of FIG. 6.
Figure 8:
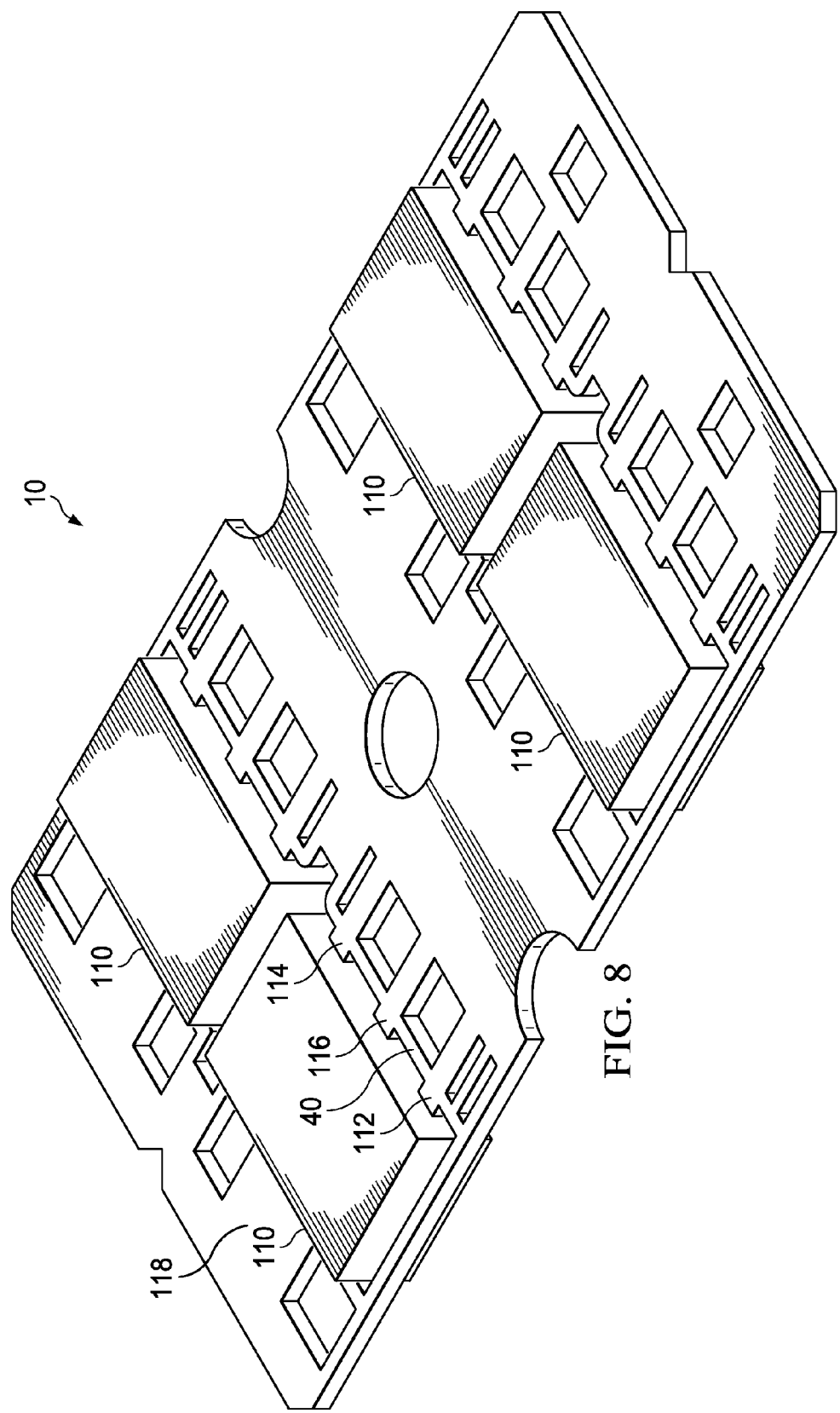
FIG. 8 is a top isometric view of a lead frame strip with encapsulated dies.

As shown by FIGS. 6 and 7, after each die 80 is mounted on the associated epoxy patch 70 and after the epoxy has cured, conductor pads 82, 84, 86, etc., on the die 80 are electrically connected to preselected silver plated regions 52, 54, 56, 58 on the ear portions 22, 24 and finger members 42, 44. The electrical connections may be made by wire bonding. A first end 89 of each of the lead wires 88, 84, 86 is attached to a conductor pad 82, 84, 86, etc. on the die 80. The second end 91 of each lead wire 88, 84 86 is welded to a predetermined one of the silver plated regions 52, 54, 56, 58. It should be noted that none of the silver plated regions 52, 54, 56, 58 are located on the central body portion 20. Thus none of the lead wires 88, 90, 92, 94, 96, 98 are connected to the central body portion 20 of the lead frame 12. Wire bonding connections are well known to those skilled in the art.

Figure 9:
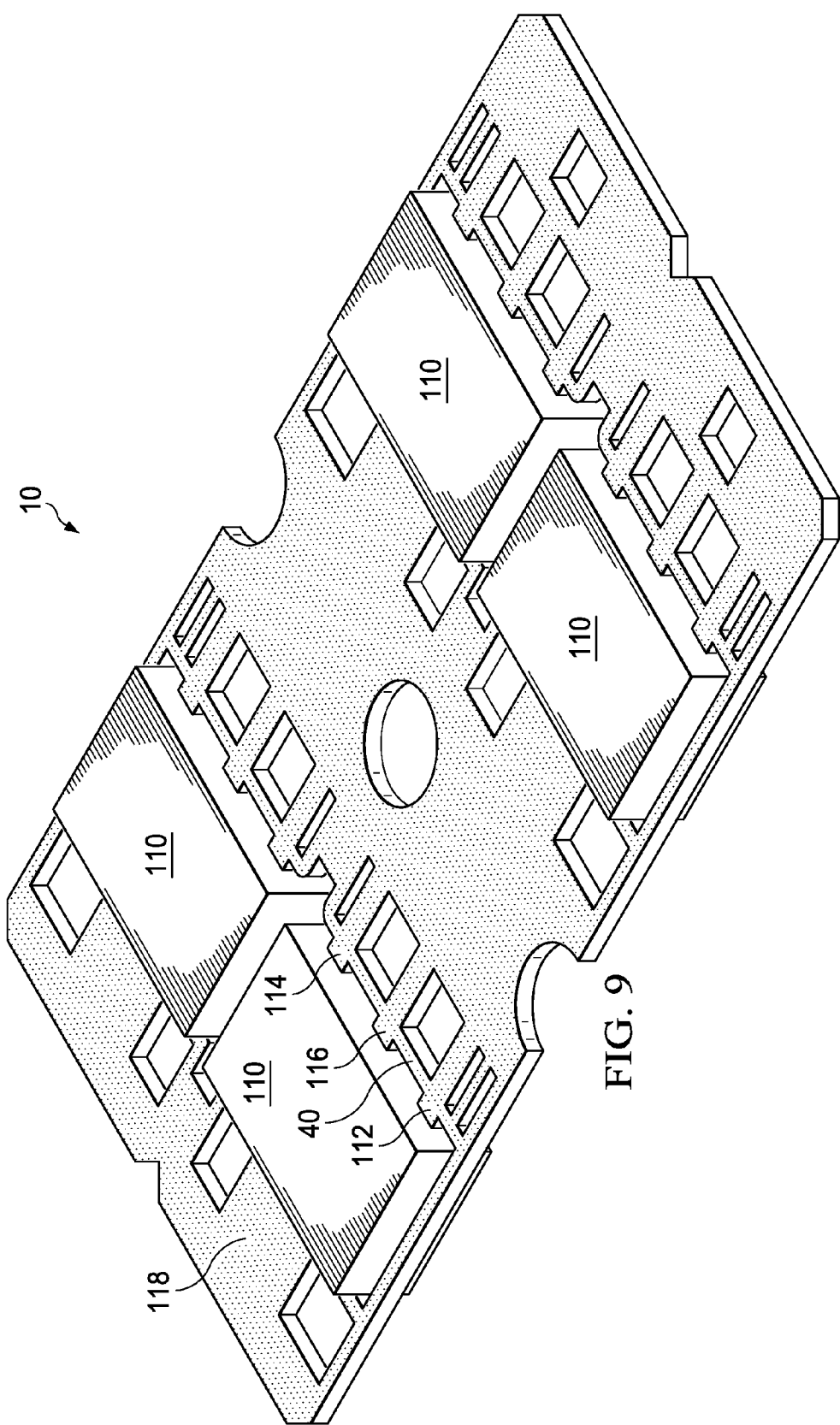
FIG. 9 is a top isometric view of an encapsulated lead frame strip after plating.

After leaving the wire bonding station, the strip 10 is next moved to an encapsulation apparatus such as a transfer mold (not shown). Protective material such as epoxy encapsulant layer 110 is s applied to the lead frame strip 10 so as to completely cover the die 80 and wires 88, 90, 92, 94, 96, 98. The central body portion 20 and finger members 42, 44 are also covered with encapsulant, except for laterally outer portions 112, 114, 116, 118 thereof. Next, as illustrated in FIG. 9, the portion of the lead frame strip 10 that is not covered by encapsulation layer 110 is tin plated, and thus the exposed end portions 112, 114, 116, 118 are tin plated.

Figure 10:
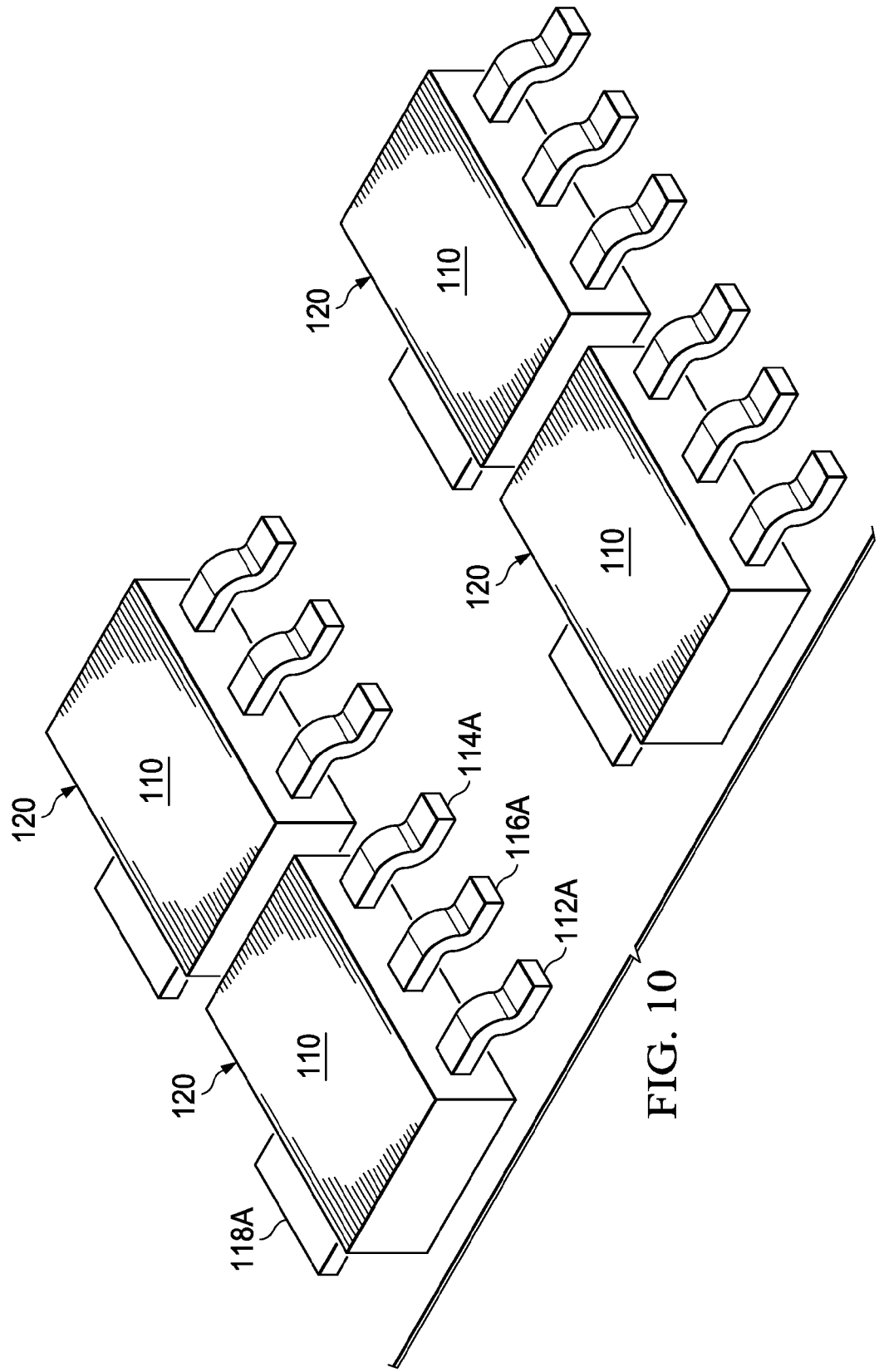
FIG. 10 is a top isometric view of the lead frame strip of FIG. 9 after singulation.

As illustrated by FIG. 10, the lead frame strip 10 is next singulated to separate the portions 112, 114, 116, 118 from the rest of lead frame strip so as to create a plurality of integrated circuit ("IC") devices 120 having IC terminals 112A, 114A, 116A, 118A.

The functions of certain structures of each lead frame 12 will now be described with reference to FIGS. 11 and 12. FIG. 11 is a cross sectional view of a lead frame 12 after application of an epoxy patch layer 70 thereto. Epoxy, before curing, is in a liquid stage and has a tendency to flow in all directions including into areas not covered by the die and into areas where lead wires will eventually be attached, which is undesirable. As illustrated by FIG. 11, the longitudinal grooves 26, 28 tend to prevent this from happening. Terminal edges 111, 113 constrain the outward flow of epoxy because the surface tension of the epoxy causes it to form a meniscus 72 at each edge, which resists outward travel of the epoxy. The grooves 26, 28 also help by providing a reservoir for the epoxy to flow into in the event that the flow resisting force of the meniscus is overcome. In other words the epoxy 70 will flow into the cavity provided by each of the grooves 26, 28 rather than flowing onto the surface of each of the ear portions 22, 24.

FIG. 12 shows a cross section of one lateral half of a completed IC device 120 showing central portion 20, ear portion 22, finger portion 42 and the epoxy layer 70 and die 80 mounted on the central body portion 20. The lead wires 88, etc., attached to the top surface 14 of the die 80 and the silver plated portions 52, 56 of the ear portion 22 and finger member 42 are also covered by encapsulation layer 110. The encapsulant which forms encapsulation layer 110, when it is in a liquid state in the transfer mold, flows into each of the longitudinal grooves 26 and through the hole/slot 32 and through the opening 50 between the ear portion 22 and the finger member 42. After the encapsulant has cured and solidified, the portion of the encapsulation layer 110 positioned within groove 26, hole/slot 32 and opening 50 locks the encapsulation layer 110 against displacement with respect to the ear portion 22 and finger member 42. After the encapsulation layer has solidified around the lead frame 12, there is a tendency for the lead frame 12 to separate from the adjacent area of the encapsulation layer 110 during thermal cycles, due to the greater expansion rate of copper as compared to the expansion rate of encapsulant. Applicant has discovered that in conventional encapsulated dies, this relative displacement of the lead frame 12 with respect to the encapsulation layer 110 can cause the lead wire welds to break. However, due to the locking action of the groove 26, slot 32 and opening 50 in applicants' lead frame 12 there is relatively little displacement. In other words the surface portions of the encapsulant layer 110 that abut the surfaces of the lead frame 12 that define these openings 26, 32, 50, keeps the adjacent portion of the lead frame 12 relatively fixed with respect to the encapsulation layer 110. As a result, there is very little displacement of the encapsulation layer 110 relative to the wire welds 89, 91, 93, etc. on the lead frame 112. Thus, these wire welds are not damaged and a major cause of IC failure is obviated.

Although certain embodiments of an encapsulated integrated circuit ("IC") assembly and a method of making such an assembly have been described in detail herein, it is to be understood that the assembly and method are not limited to these specific embodiments and may be otherwise constructed. It is intended that the appended claims be broadly construed so as to encompass such alternative embodiments, except to the extent limited by the prior art.

What is claimed is:

1. An integrated circuit device comprising:
 a conductive lead frame having a die pad that comprises:
  a relatively larger central body portion;
  at least one relatively smaller peripheral portion in electrical continuity with said central body portion and projecting laterally outwardly from said central body portion and having at least one abutment surface thereon, wherein said at least one relatively smaller peripheral portion comprises a first ear projecting from a first lateral side of said central body portion and a second ear projecting from a second lateral side of said central body portion and wherein said at least one abutment surface comprises a surface defining a first groove in said first ear and a surface defining a second groove in said second ear;
 a die having a plurality of conductor pads on a top surface thereof and having a bottom surface attached to said central body portion;
 at least one wire bonded at a first end thereof to one of said conductor pads and at a second end thereof to said at least one peripheral portion, and wherein no lead wire is connected between any of said conductor pads and said central body portion; and
 an encapsulation layer covering said die, said wires and at least a portion of said lead frame and having a portion abuttingly engaging said at least one abutment surface so as to resist lateral displacement of said peripheral portion relative to said encapsulation layer in the proximity of said at least one abutment surface.

2. The integrated circuit device of claim 1 wherein said at least one peripheral portion comprises a plated portion and wherein said central body portion comprises no plated portion.

3. The integrated circuit device of claim 2 wherein said at least one of said wire ends connected to said at least one peripheral portion is connected to said plated portion of said peripheral portion.

4. The integrated circuit device of claim 1,
 wherein said at least one abutment surface comprises a surface defining a first hole in said first ear and a surface defining a second hole in said second ear.

5. The integrated circuit device of claim 1 further comprising:
 a first plated region on said first ear and a second plated region on said second ear.

6. The integrated circuit device of claim 5 wherein each of said first and second plated regions are positioned laterally outwardly of said first and second holes, respectively.

7. The integrated circuit device of 1 wherein said lead frame further comprises at least one finger positioned not connected to said at least one peripheral portion and laterally separated therefrom by a space filled by said encapsulation layer.

8. The integrated circuit device of claim 7 wherein said at least one finger comprises a plated portion.

* * * * *